United States Patent
Tsai et al.

(10) Patent No.: US 9,029,226 B2
(45) Date of Patent: May 12, 2015

(54) MECHANISMS FOR DOPING LIGHTLY-DOPED-DRAIN (LDD) REGIONS OF FINFET DEVICES

(71) Applicant: Taiwan Semiconductor Manufacturing Company, Ltd., Hsin-Chu (TW)

(72) Inventors: Chun Hsiung Tsai, Xinpu Township (TW); Tsan-Chun Wang, Hsin-Chu (TW); Su-Hao Liu, Jhongpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/912,903

(22) Filed: Jun. 7, 2013

(65) Prior Publication Data

US 2014/0264575 A1 Sep. 18, 2014

Related U.S. Application Data

(60) Provisional application No. 61/780,784, filed on Mar. 13, 2013.

(51) Int. Cl.
*H01L 21/336* (2006.01)
*H01L 29/66* (2006.01)
*H01L 29/78* (2006.01)

(52) U.S. Cl.
CPC .... *H01L 29/66492* (2013.01); *H01L 29/66795* (2013.01); *H01L 29/7835* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 5,407,847 | A | 4/1995 | Hayden et al. |
| 5,877,072 | A | 3/1999 | Andideh et al. |
| 6,071,762 | A | 6/2000 | Wu et al. |
| 6,137,149 | A | 10/2000 | Kodama |
| 6,238,989 | B1 | 5/2001 | Huang et al. |
| 7,030,012 | B2 | 4/2006 | Divakaruni et al. |
| 7,157,374 | B1 | 1/2007 | Waite et al. |
| 7,928,427 | B1 | 4/2011 | Chang |
| 8,053,273 | B2 | 11/2011 | Kammler et al. |
| 8,053,344 | B1 | 11/2011 | Fung et al. |
| 8,211,784 | B2 | 7/2012 | Hong et al. |
| 8,357,579 | B2 | 1/2013 | Wong et al. |

(Continued)

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.

(Continued)

Primary Examiner — Yasser A Abdelaziez
(74) Attorney, Agent, or Firm — Slater & Matsil, L.L.P.

(57) ABSTRACT

The embodiments of mechanisms for doping lightly doped drain (LDD) regions by driving dopants from highly doped source and drain regions by annealing for finFET devices are provided. The mechanisms overcome the limitation by shadowing effects of ion implantation for advanced finFET devices. The highly doped source and drain regions are formed by epitaxial growing one or more doped silicon-containing materials from recesses formed in the fins. The dopants are then driven into the LDD regions by advanced annealing process, which can achieve targeted dopant levels and profiles in the LDD regions.

19 Claims, 13 Drawing Sheets

(56) References Cited

U.S. PATENT DOCUMENTS

| | | |
|---|---|---|
| 2001/0023108 A1 | 9/2001 | Miyano et al. |
| 2005/0077570 A1 | 4/2005 | Nishinohara |
| 2005/0095799 A1 | 5/2005 | Wang et al. |
| 2005/0151203 A1 | 7/2005 | Cho et al. |
| 2005/0184311 A1 | 8/2005 | Murthy et al. |
| 2006/0084235 A1 | 4/2006 | Barr et al. |
| 2006/0088968 A1 | 4/2006 | Shin et al. |
| 2006/0115933 A1 | 6/2006 | Ye et al. |
| 2006/0228842 A1 | 10/2006 | Zhang et al. |
| 2006/0234504 A1 | 10/2006 | Bauer et al. |
| 2006/0289902 A1 | 12/2006 | Ping et al. |
| 2007/0093033 A1 | 4/2007 | Wang et al. |
| 2007/0235802 A1* | 10/2007 | Chong et al. .................. 257/346 |
| 2007/0259501 A1 | 11/2007 | Xiong et al. |
| 2007/0287272 A1 | 12/2007 | Bauer et al. |
| 2008/0023752 A1 | 1/2008 | Chen et al. |
| 2009/0075029 A1 | 3/2009 | Thomas et al. |
| 2009/0267118 A1 | 10/2009 | Chakravarti et al. |
| 2010/0025779 A1 | 2/2010 | Kammler et al. |
| 2010/0148270 A1 | 6/2010 | Golonzka et al. |
| 2010/0301350 A1 | 12/2010 | Tamura et al. |
| 2011/0027956 A1 | 2/2011 | Domenicucci et al. |
| 2011/0068403 A1 | 3/2011 | Hattendorf et al. |
| 2011/0095343 A1 | 4/2011 | Chan et al. |
| 2011/0117732 A1 | 5/2011 | Bauer et al. |
| 2011/0124169 A1 | 5/2011 | Ye et al. |
| 2011/0212584 A9 | 9/2011 | Chakravarthi et al. |
| 2011/0223736 A1* | 9/2011 | Lin et al. ........................ 438/305 |
| 2011/0266617 A1 | 11/2011 | Nakazawa et al. |
| 2011/0269287 A1 | 11/2011 | Tsai et al. |
| 2011/0303989 A1 | 12/2011 | Chuang et al. |
| 2011/0316044 A1 | 12/2011 | Chan et al. |
| 2012/0001228 A1 | 1/2012 | Chong et al. |
| 2012/0056245 A1 | 3/2012 | Kang et al. |
| 2012/0070954 A1 | 3/2012 | Fung et al. |
| 2012/0104498 A1 | 5/2012 | Majumdar et al. |
| 2012/0295421 A1 | 11/2012 | Brabant et al. |
| 2013/0017678 A1* | 1/2013 | Tsai et al. ...................... 438/591 |
| 2013/0056795 A1 | 3/2013 | Wu et al. |
| 2013/0157431 A1 | 6/2013 | Tsai et al. |
| 2013/0307076 A1 | 11/2013 | Cheng et al. |
| 2013/0328126 A1 | 12/2013 | Tsai et al. |
| 2014/0170840 A1 | 6/2014 | Tsai et al. |

OTHER PUBLICATIONS

Fischer, P. R. et al., "Low Temperature Silcore Deposition of Undoped and Doped Silicon Films," 2006, pp. 203-215, vol. 3, Issue 2, ECS Transactions.

Lim, Kwan-Yong et al., "Novel-Stress Memorization-Technology (SMT) for High Electron Mobility Enhancement of Gate Last High-k/Metal Gate Devices", IEEE 2010, pp. 10.1.1-10.1.4.

* cited by examiner

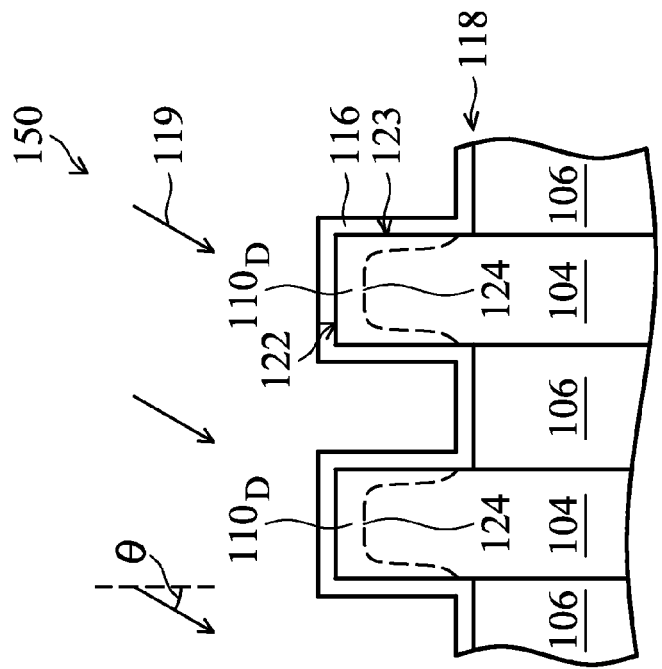
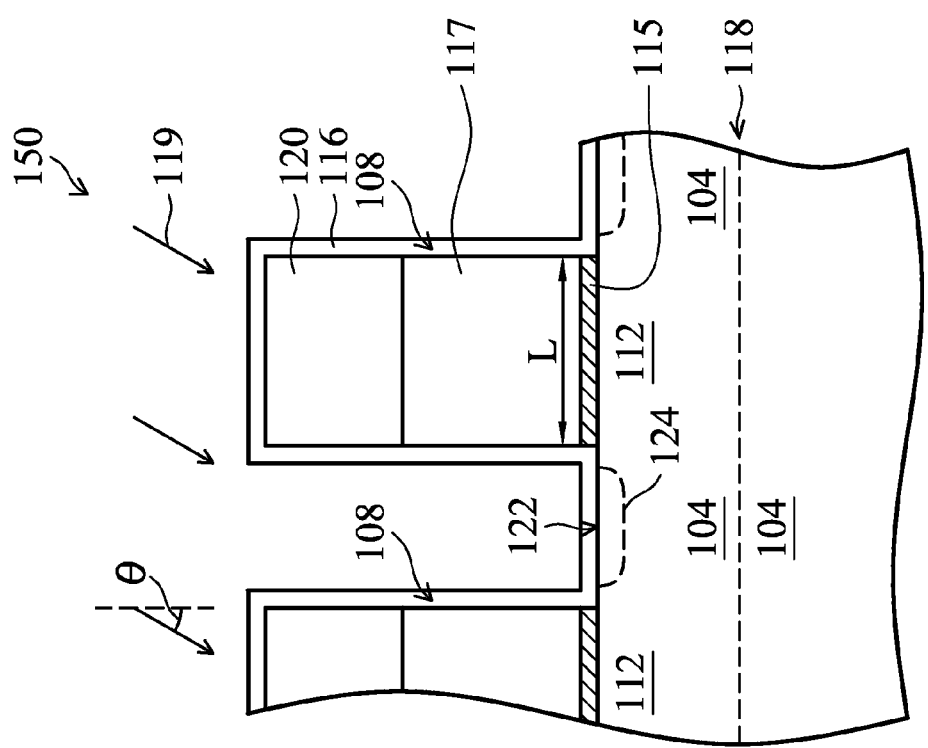
FIG. 3C
FIG. 3D

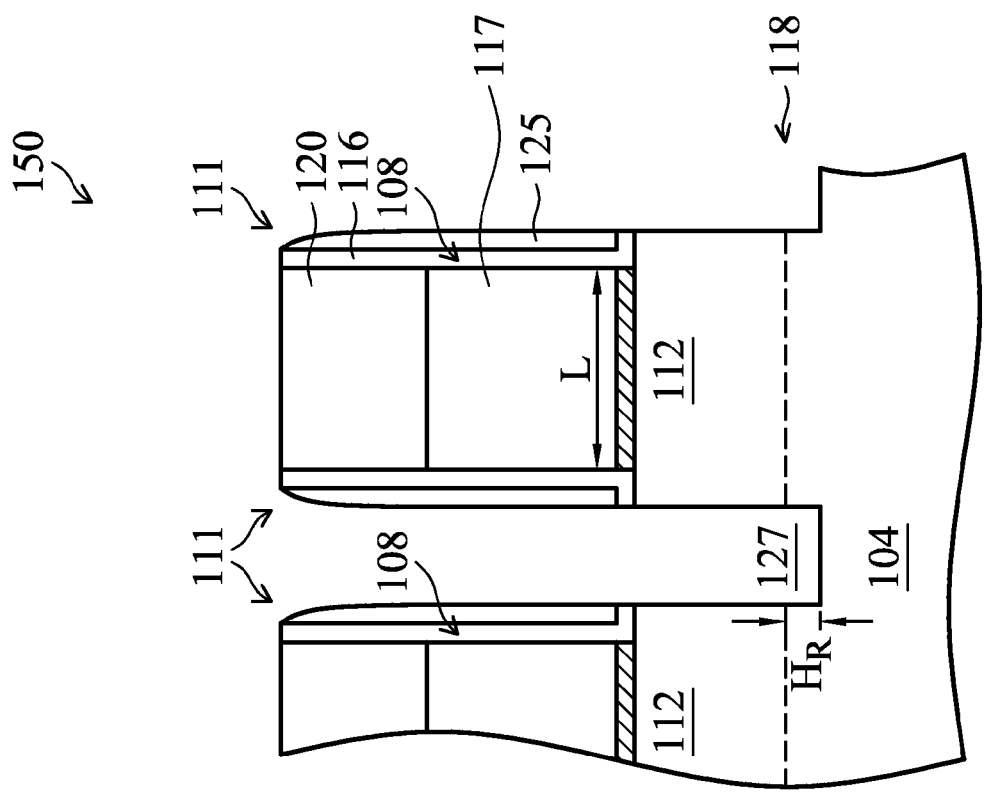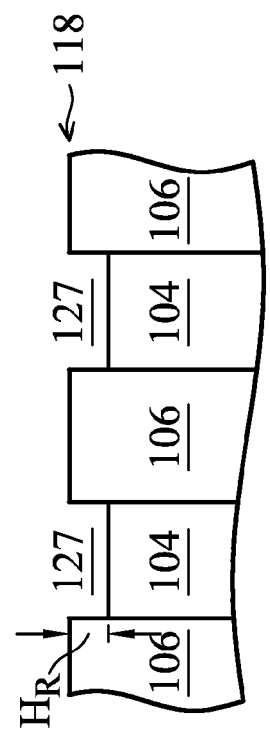
FIG. 3G
FIG. 3H

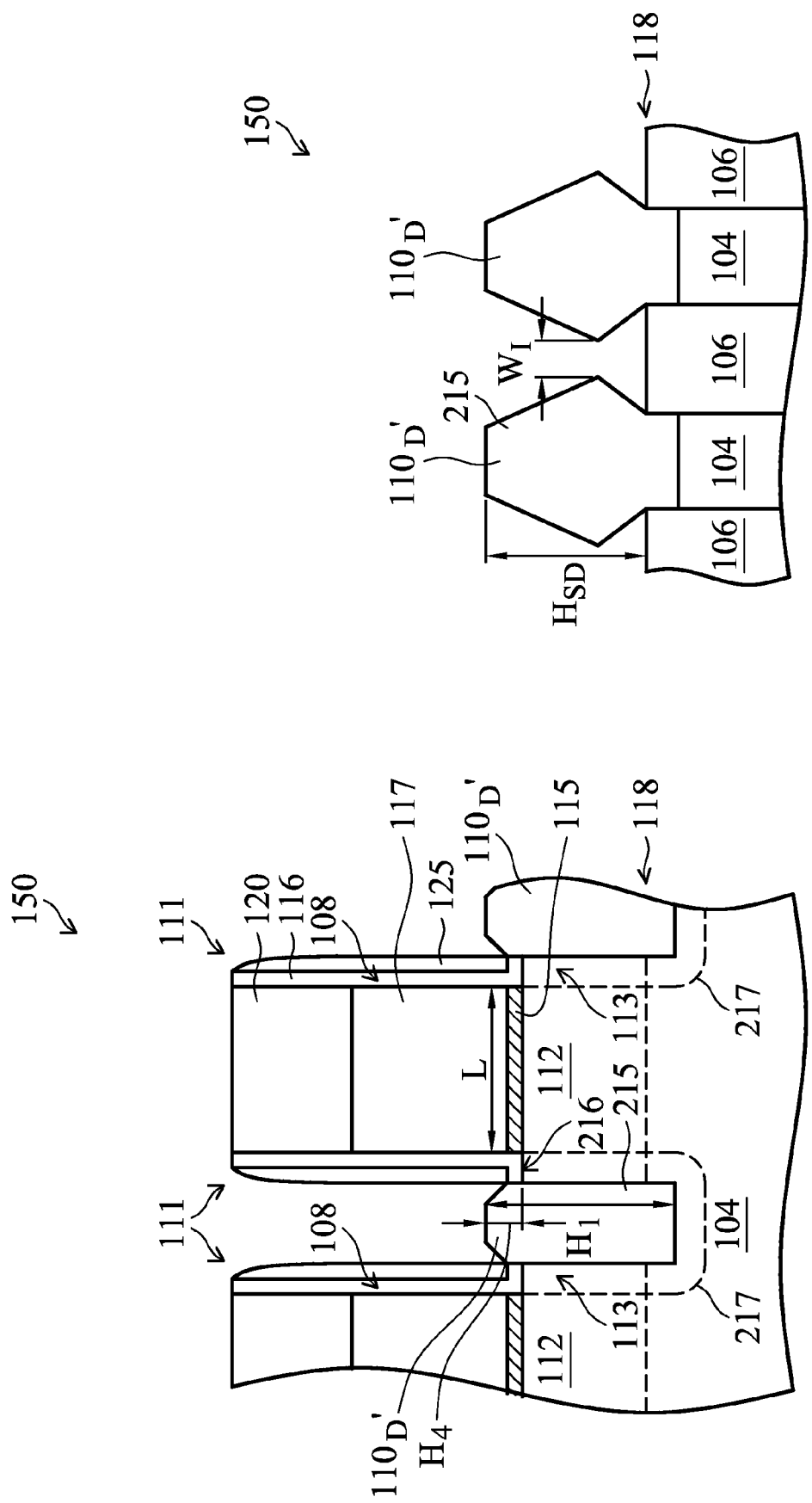

MECHANISMS FOR DOPING LIGHTLY-DOPED-DRAIN (LDD) REGIONS OF FINFET DEVICES

RELATED CASES

This application claims priority to U.S. Provisional Patent Application No. 61/780,784, filed Mar. 13, 2013, and entitled "Mechanisms for Doping Lightly-Doped-Drain (LLD) Regions of FinFet Devices," which application is incorporated herein by reference.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as finFET devices, so called because the channel is formed on a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A-3J show cross-sectional views of the transistor region of the sequential process flow of FIG. 2, in accordance with some embodiments.

DETAILED DESCRIPTION

Figure 1A:
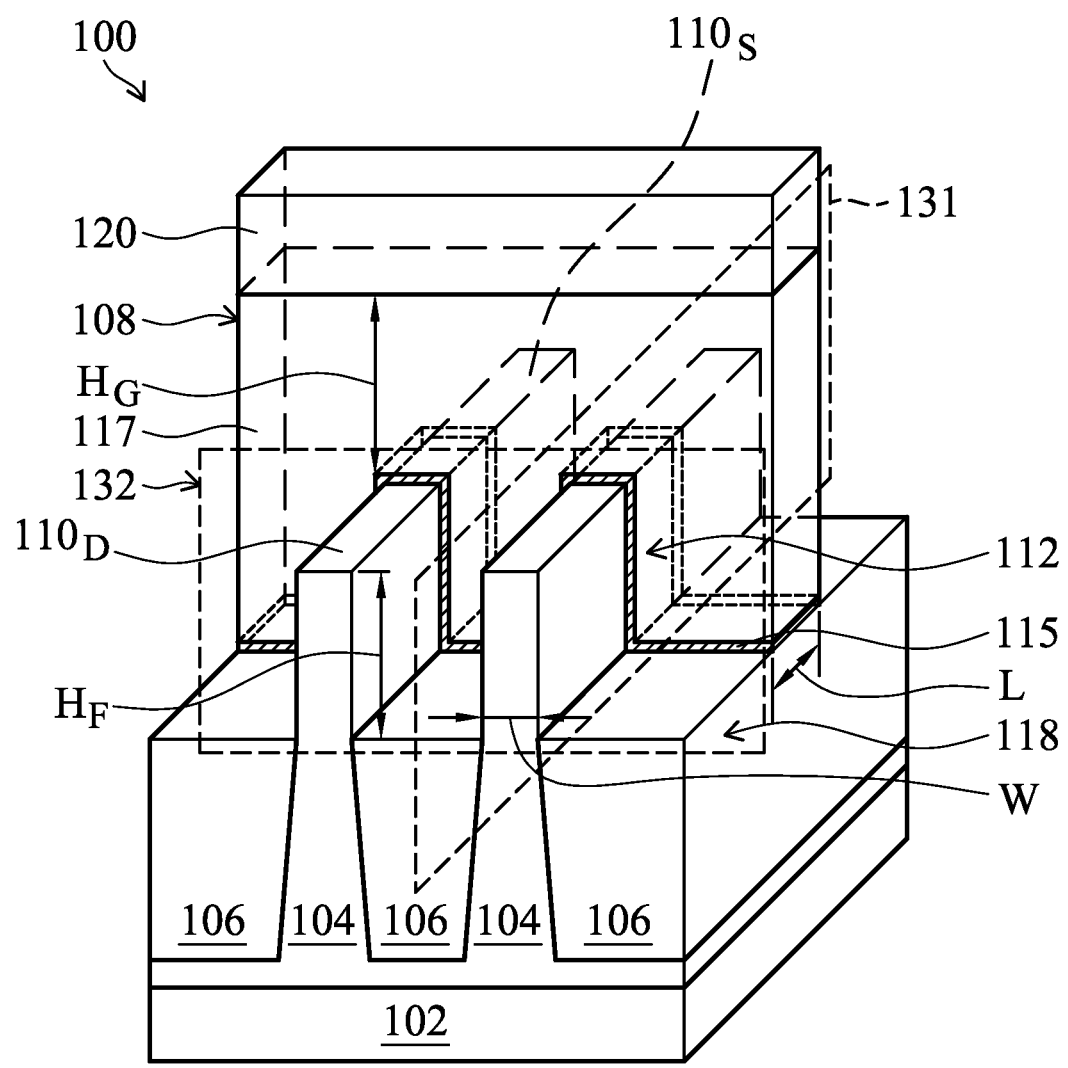
FIG. 1A is perspective view of an embodiment of a semiconductor device structure, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure may repeat reference numerals and/or letters in the various examples. This repetition is for the purpose of simplicity and clarity and does not in itself dictate a relationship between the various embodiments. It is understood that those skilled in the art will be able to devise various equivalents that, although not specifically described herein that embody the principles of the present disclosure.

It is also noted that the present disclosure presents embodiments in the form of multi-gate transistors or fin-type multi-gate transistors referred to herein as finFET devices. Such a device may include a p-type metal oxide semiconductor finFET device or an n-type metal oxide semiconductor finFET device. The finFET device may be a dual-gate device, tri-gate device, and/or other configuration. FinFET devices may be included in an IC such as a microprocessor, memory device, and/or other IC. One of ordinary skill may recognize other embodiments of semiconductor devices that may benefit from aspects of the present disclosure.

Illustrated in FIG. 1A is perspective view of a semiconductor device structure 100, in accordance with some embodiments. The semiconductor device structure 100 includes finFET type structures. The semiconductor device structure 100 includes a substrate 102, a plurality of fins 104, a plurality of isolation structures 106, and a gate structure 108 disposed on each of the fins 104. The gate structure 108 may include a gate dielectric layer 115, a gate electrode layer 117, and/or one or more additional layers. A hard mask layer 120 is over the gate electrode layer 117. The hard mask layer 120 is used to pattern, such as by etching, the gate structure 108. In some embodiments, the hard mask layer 120 is made of a dielectric material, such as silicon oxide. The perspective view of FIG. 1A is taken after the patterning (or forming) process of gate structure 108. FIG. 1A shows only one gate structure 108. There may be additional gate structure(s) (not shown) similar and parallel to the gate structure 108 shown in FIG. 1A.

Each of the plurality of fins 104 include a source region $110_S$ and a drain region $110_D$, where source or drain features are formed in, on, and/or surrounding the fin 104. A channel region 112 of the fin 104 underlies the gate structure 108. The channel region 112 of fin 104 has a length (gate length) L, and a width (gate width) W, as shown in FIG. 1A. In some embodiments, the length (gate length) L is in a range from about 10 nm to about 30 nm. In some embodiments, the width (gate width) W is in a range from about 10 nm to about 20 nm. The height (gate height) $H_G$ of gate structure 108, measured from the top of fin 104 to the top of gate structure 108, is in a range from about 50 nm to about 80 nm, in some embodiments. The height (fin height) $H_F$ of fin 104, measured from the surface of isolation structure 106 to the top of fin 104, is in a range from about 25 nm to about 35 nm, in some embodiments.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 102 is a semiconductor on insulator (SOI).

The isolation structures 106 are made of a dielectric material and may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures are STI features and are formed by etching trenches in the substrate 102. The trenches may then be filled with isolating material, followed by a chemical mechanical polish (CMP). Other fabrication techniques for the isolation structures 106 and/or the fin structure 104 are possible. The isolation structures 106 may include a multi-layer structure, for example, having one or more liner layers.

The fin structures 104 may provide an active region where one or more devices are formed. In an embodiment, a channel region (112) of a transistor device is formed in the fin 104. The fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms recesses into isolation structures 106, leaving protruding fins. The recesses may be etched using reactive ion etch (RIE) and/or other suitable processes. Numerous other embodiments of methods to form the fins 104 on the substrate 102 may be suitable.

The gate structure 108 may include a gate dielectric layer 115, a gate electrode layer 117, and/or one or more additional layers. In an embodiment, the gate structure 108 is a sacrificial gate structure such as formed in a replacement gate process used to form a metal gate structure. In an embodiment, the gate structure 108 includes polysilicon layer (as the gate electrode layer 117).

The gate dielectric layer 115 of the gate structure 108 may include silicon dioxide. The silicon oxide may be formed by suitable oxidation and/or deposition methods. Alternatively, the gate dielectric layer of the gate structure 108 may include a high-k dielectric layer such as hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In an embodiment, the gate structure 108 may be a metal gate structure. The metal gate structure may include interfacial layer(s), gate dielectric layer(s), work function layer(s), fill metal layer(s) and/or other suitable materials for a metal gate structure. In other embodiments, the metal gate structure 108 may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable formation process.

Exemplary p-type work function metals that may be included in the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The semiconductor device structure 100 described above includes fins 104 and gate structure 108. The semiconductor device structure 100 needs additional processing to form various features, such as lightly doped drain (LDD) regions and doped source/drain regions, of the transistor utilizing structure 100. LDD regions are next to channel regions and are under spacers. The term LDD regions are used to describe lightly doped regions next to both source and drain regions.

Figure 1B:
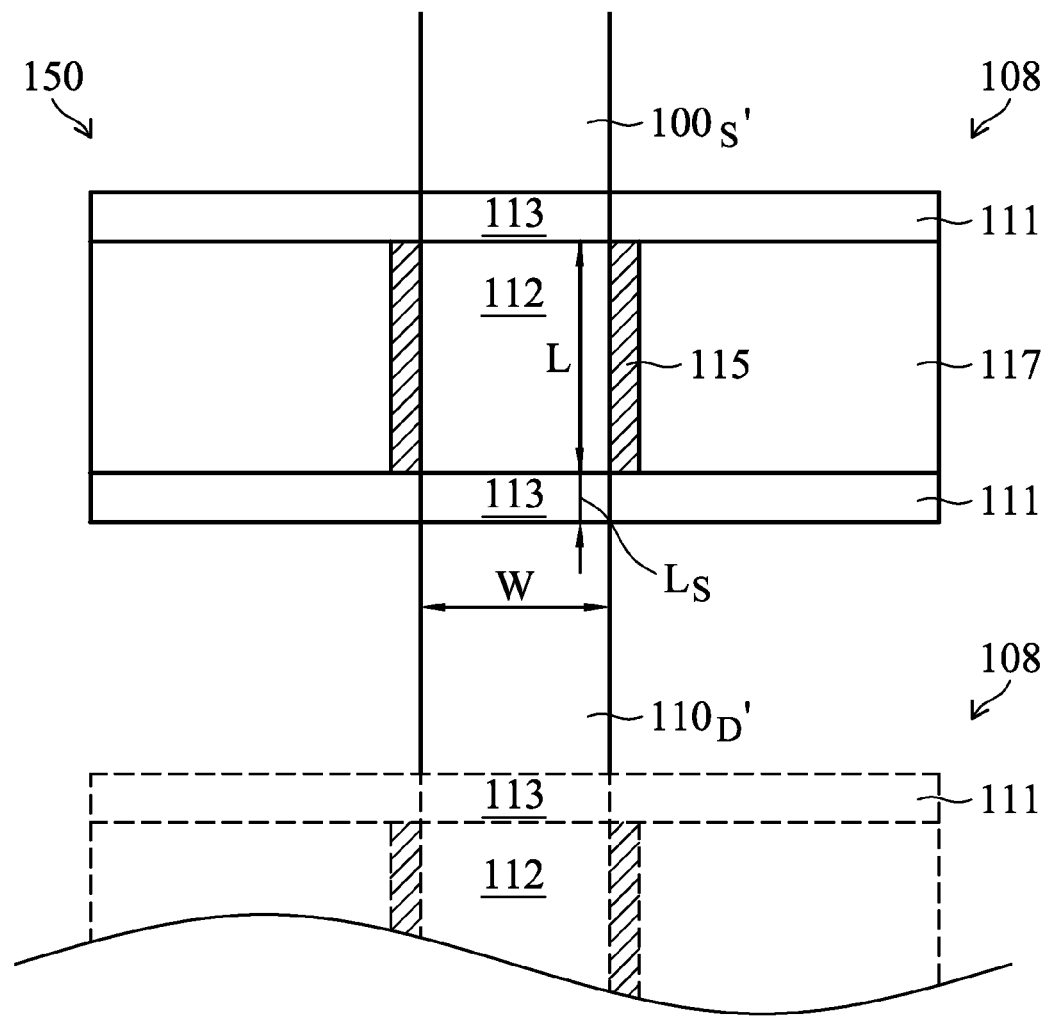
FIG. 1B shows a top view of a transistor region, in accordance with some embodiments.

FIG. 1B shows a top view of a transistor region 150 formed with one of the fins 104 of FIG. 1A and taken on a surface level with the top surface 118 of isolation structure 106, in accordance with some embodiments. Transistor region 150 includes a doped source region $110_S'$ and a doped drain region $110_D'$, which have the same cross-sections as doped source regions $110_S$ and doped drain region $110_D$, respectively, of FIG. 1A at surface 118.

Transistor region 150 also includes a channel region 112, which is part of fin 104 and is surrounded by gate structure 108 on 3 sides, as shown in FIG. 1A. The channel region 112 has a length (gate length) L and a width (gate width) W. Transistor region 150 also includes gate dielectric layer 115 and gate electrode layer 117. FIG. 1B shows LDD regions 113 between source region $110_S$ and channel region 112, and between drain region $110_D$ and channel region 112. The LDD regions 113 have a width W and a length $L_S$, which is defined by the width of spacers 111. In some embodiments, Ls is in a range from about 5 nm to about 10 nm. FIG. 1B shows another gate structure 108 by dotted lines. This other gate structure 108 has been described above as being similar and parallel to the gate structure 108 and is not shown in FIG. 1A.

The transistor region 150 has features that are not shown in FIG. 1A, such as LDD region 113 and spacers 111, and features that are different from those in FIG. 1A, such as doped source/drain regions $110_S'$, $110_D'$ (to be described below). Processing sequence and structures involved in forming the LDD regions 113, spacers 111, and doped source/drain regions $110_S'$, $110_D'$ are described below. Doping LDD regions 113 is a challenge for finFET devices, because LDD regions 113 are shadowed by the tall gate structures if ion implantation is employed. The fine spacing, which is in the range of nanometers (nm), between neighboring gate structures 108 also limits the usage of plasma doping due to the relatively larger plasma sheath thickness, which is in the range of millimeters (mm). Consequently, there is a need for a mechanism of doping the LDD regions 113 for advanced finFET devices.

Figure 2:
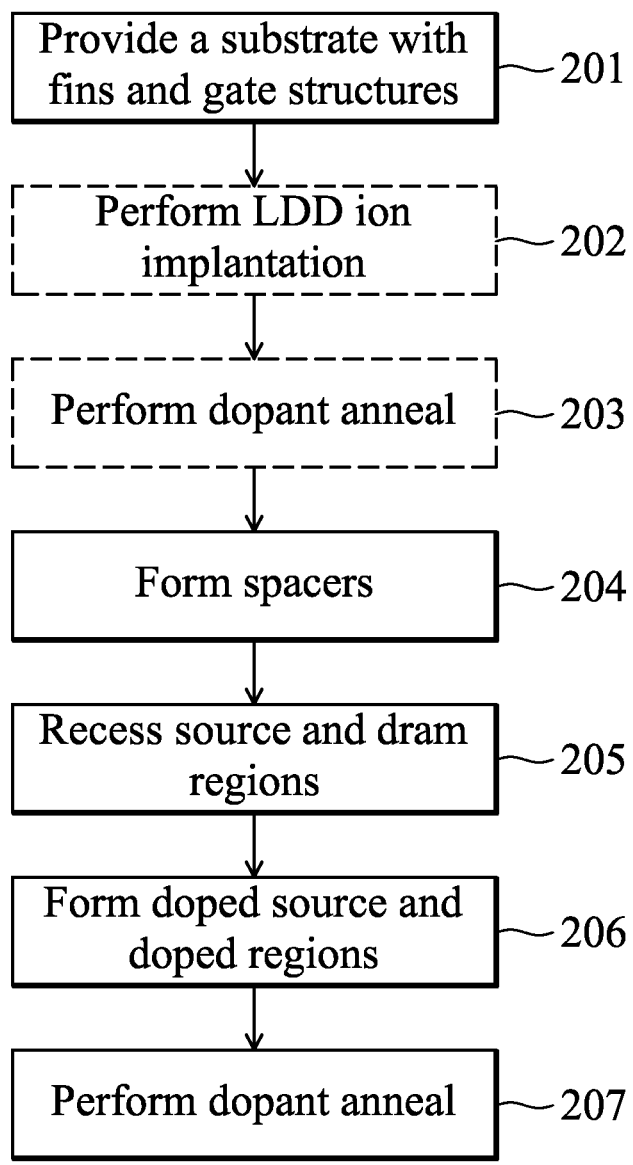
FIG. 2 shows a sequential process flow of doping lightly doped drain (LDD) regions and source/drain regions in a transistor region, in accordance with some embodiments.

FIG. 2 shows a sequential process flow 200 of doping LDD regions and source/drain regions in transistor region 150, in accordance with some embodiments. FIGS. 3A-3J show cross-sectional views of the transistor region of the sequential process flow of FIG. 2, in accordance with some embodiments. The processing sequence and structures described below are mainly for N-type finFET devices. However, at least portions of the embodiments described below may be applied for P-type finFET devices.

Process flow 200 begins at an operation 201 during which a substrate with fins and gate structures, such as the one shown in FIG. 1A, is provided. The substrate undergoes various processing sequences to form the structures, such as fins 104, isolation structures 106, and gate structure(s) 108.

Figure 3A:
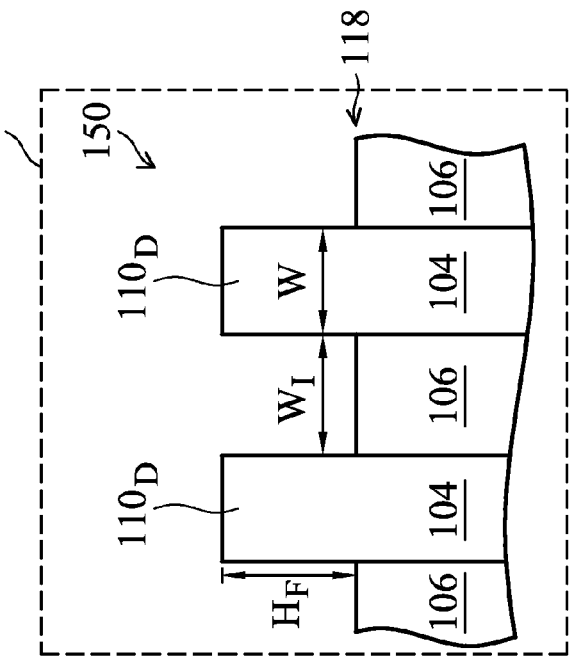

FIG. 3A shows a cross-sectional view transistor region 150 according to the cut 131 illustrated in FIG. 1A, in accordance with some embodiments. FIG. 3A shows two neighboring gate structures 108. As mentioned above, there may be additional gate structure(s) similar and parallel to the gate structure 108 shown in FIG. 1A. FIG. 3A shows two neighboring gate structures 108 in FIG. 3A are formed over one fin 104 and are separated by a source/drain region, which could either be the source region $110_S$ or the drain region $110_D$. For simplicity of discussion, we designate the source/drain region as drain region $110_D$ to correlate to FIG. 1B described above. Each gate structure 108 includes a gate electrode layer 117 and a gate dielectric layer 115. A hard mask layer 120 is formed over the gate electrode layer 117. The hard mask layer 120 is used in assisting patterning of gate structures 108. In some embodiments, the thickness $H_1$ of hard mask layer 120 is in a range from about 70 nm to about 100 nm. The thickness $H_2$ of gate electrode layer 117 is in a range from about 80 nm to about 100 nm, in some embodiments. The thickness $H_3$ of gate dielectric layer 115 is in a range from about 2 nm to about 3 nm, in some embodiments. The channel length L is shown in FIG. 3A as equal to the width of gate electrode layer 117 of a gate structure 108. Channel regions 112, which are directly under the gate structures 108 are also noted in FIG. 3A.

Figure 3B:
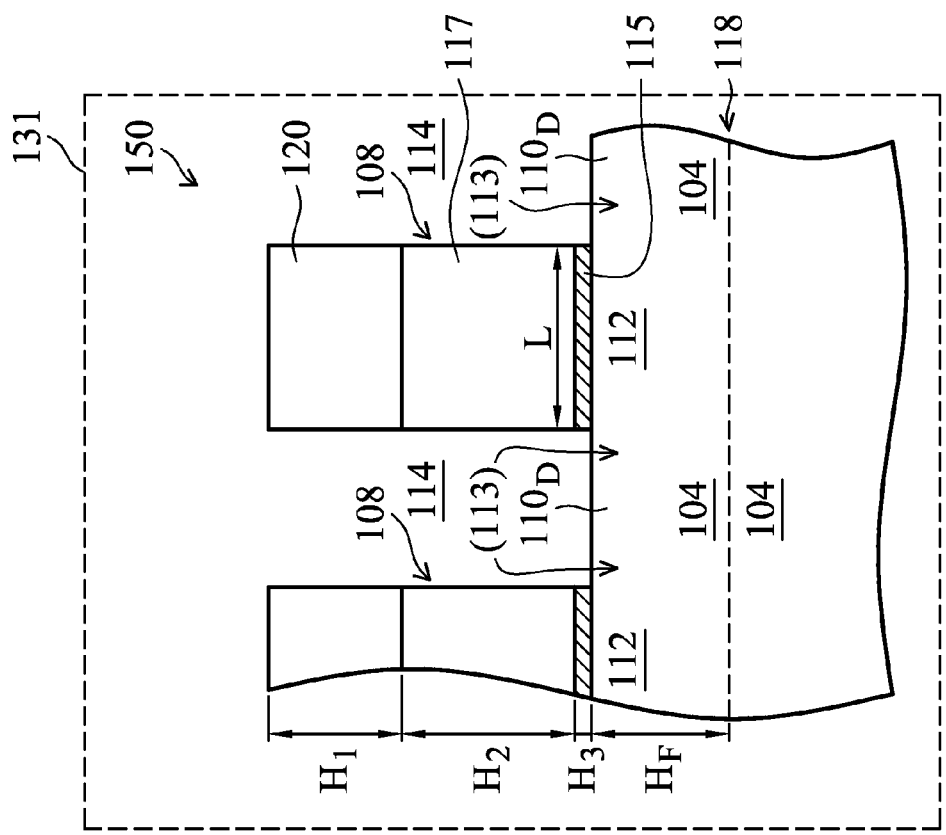

FIG. 3B shows a cross-sectional view of transistor region 150 according to the cut 132 illustrated in FIG. 1A, in accordance with some embodiments. FIG. 3B shows two neighboring fins 104 separated (or isolated) from each other by an isolation structure 106. Each of the two neighboring fins 104 has isolation structures 106 on both sides. Each fin 104 has a portion protruding above surfaces 118 of neighboring isolation structures 106. The protruding portions of fins 104 are drain regions $110_D$. Each drain region $110_D$ has a height $H_F$ and a width W (also called gate width). In some embodiments, $H_F$ is in a range from about 25 nm to about 35 nm. The height $H_F$ of the drain region $110_D$ is also noted in FIG. 3A. A dotted line 118 indicates the level of surfaces of isolation regions 106. The distance $W_I$ between the two neighboring drain regions $110_D$ (or top portions of fins 104) is in a range from about 10 nm to about 20 nm.

As mentioned above with regard to FIG. 1B, LDD regions 113 need to be formed by doping the regions. LDD regions (113) are not doped at this stage yet and are located next to the edges of gate dielectric layer 115 in fins 104 indicated (113) with arrows pointing to the region in FIG. 3A. Ion implantation has been used as a doping process for many technology nodes. Ion implantation is directional and could be affected by shadowing effect as a result of high aspect ratio of the openings 114 above the LDD regions 113. The gate structures 108 (along with the hard mask layer 120) surrounding openings 114 blocks the line of sights of doping ions arriving from above the surfaces of substrate 102. As a result, limited amount of dopants can reach LDD regions 113. However, ion implantation can be used in some embodiments to implant some amount of dopants in LDD regions 113. In some embodiments, ion implantation is not used.

FIG. 2 shows an optional operation 202, during which ion implantation is perform to dope at least a portion of the LDD regions 113. Another doping mechanism will be described below to provide sufficient dopant level for the LDD regions 113. In some embodiments, ion implantation is not used. To dope the LDD regions 113 by implant, a spacer layer 116 is deposited over substrate 102 to cover gate structures 108 (which have a hard mask layer 120 over the structures), and exposed surfaces of fins 104, such as drain regions $110_D$, as shown in FIG. 3C in accordance with some embodiments. The spacer layer 116 is made of a dielectric material, such as silicon oxide, silicon oxynitride (SiON), or silicon nitride (SiN). In some embodiments, the deposition process is a plasma-enhanced chemical vapor deposition (PECVD) process. Other applicable deposition processes may also be used. In some embodiments, the thickness of spacer layer 116 is in a range from about 2 nm to about 4 nm. The spacer layer 116 provides an offset distance, which is the thickness of spacer layer 116, from the channel region 112 and prevents the dopants from being implanted in the channel region 112.

FIG. 3C shows an ion implantation process 119 being performed on substrate 102 to dope LDD regions 113. The dopant ions of the ion implantation process 119 could move toward the surface of substrate 102 at an angle θ, as shown in FIG. 3C. The angle θ is in a range from about 0 degree to about 45 degrees, in accordance with some embodiments. For N-type finFET devices, the dopants could be phosphorus (P), or arsenic (As). The dopants penetrate the spacer layer 116 to reach the exposed regions of fin 104. The dopant level in LDD regions 113 is in a range from about 1E20 to about 5E20 atoms/cm$^3$. Due to shadowing effect of neighboring gate structures, it is difficult to achieve high dopant level in LDD regions 113. As a result, other mean(s) of doping is needed.

After the dopant ions are implanted, a thermal anneal is performed to drive in and to activate the dopants at operation 203, in accordance with some embodiments. The thermal anneal may utilize rapid thermal processing (RTP) anneal, spike anneal, millisecond anneal, or laser anneal. Spike anneal operates at peak anneal temperature in the order of second. Millisecond anneal operates at peak anneal temperature in the order of milliseconds and laser anneal operates at peak anneal temperature in the order of micro seconds.

The source and drains regions $110_S$ and $110_D$ are also doped by ion implantation. FIG. 3D shows drain regions $110_D$ are doped. Due to the line-of-sight, the top surfaces 122 drain regions $110_D$ receive more dopants than the sidewalls 123. The lower corners of regions $110_D$ would receive the least amounts, compared to other surfaces shown in FIG. 3D. The dotted line profiles 124 are used to illustrate the depths of dopants. The regions with higher dopant concentrations (or levels) correlate to higher depths of dopants. As mentioned above, the processing sequence and structures described below are mainly for N-type finFET. Substrate 102 could have both P-type and N-type devices. Additional processes, such as lithography patterning processes, would be involved to protect the P-type device regions from dopant ions for N-type devices. The processing sequence involved in forming and doping the P-type devices are not described in this disclosure.

Spacers 111 are formed at operation 204, either after operation 201, 202, or 203 (depending on the process flow used). As mentioned above, spacer layer 116 is deposited to provide an offset. Spacer layer 116 may also be called an offset spacer layer. In some embodiments, the spacers include another spacer layer 125, which may also be called a main spacer layer. Spacer layer 125 has a thickness in a range from about 5 nm to about 10 nm. Spacer layer 125 is made of a dielectric material, such as silicon oxynitride (SiON), silicon nitride (SiN), or carbon-doped silicon nitride (SiCN). SiCN has relatively low etch rate against etchants, such as $H_3PO_4$ and HF, in comparison to SiN or SiON. In some embodiments, the deposition process is a plasma-enhanced chemical vapor deposition (PECVD) process. Other applicable deposition process may also be used. In some embodiments, each of spacers 111 has a width (or added thickness of spacer layers 116 and 125) in a range from about 5 nm to about 10 nm.

Figure 3E:
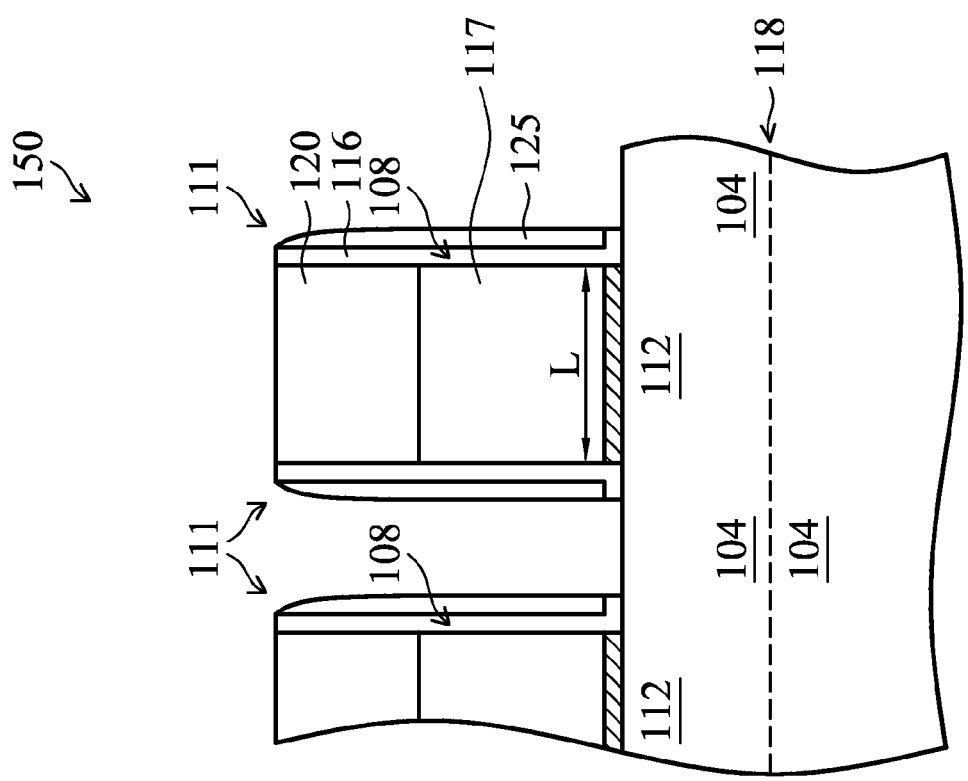
Figure 3F:
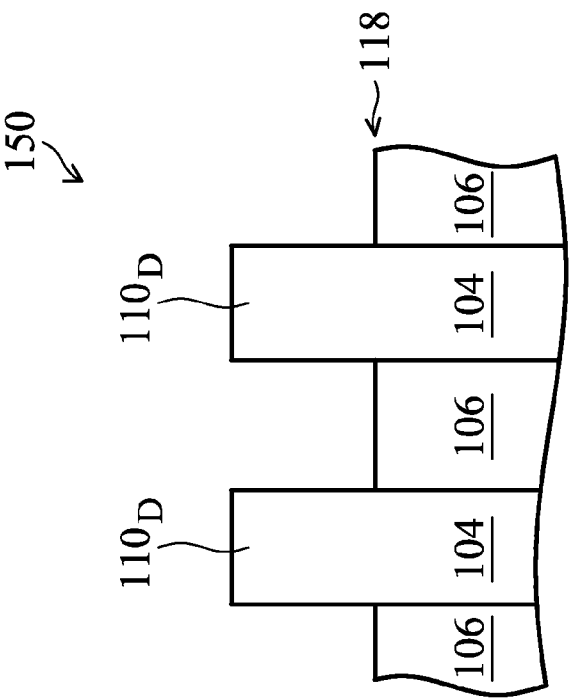

An etch process is then performed to remove spacer layers over the hard mask layer 120 and also over other horizontal surfaces of substrate 102. The etch process leaves the offset spacer layer 116 and at least a portion of main spacer layer 125 on the side walls of gate structures 108 and hard mask layer 120 over the gate structures 108. FIGS. 3E and 3F show cross-sectional views of FIGS. 3C and 3D, respectively, after spacers 111 are formed, in accordance with some embodiments.

After spacers 111 are formed, the source and drain regions of N-type devices) are recessed by etching at operation 205. One or more etching processes may be used to recess the source and drain regions. The etching process(es) may include a dry process(es), such as a plasma etching process, a wet etching process(es), or a combination of both. In some embodiments, a wet etch is used to form the recesses 127. For example, an etchant such as carbon tetrafluoride ($CF_4$), HF, tetramethylammonium hydroxide (TMAH), or combinations of thereof, or the like may be used to perform the wet etch and form the recesses 127.

FIGS. 3G and 3H show cross-sectional views of FIGS. 3E and 3F after recesses 127 are formed, in accordance with some embodiments. Prior to recessing the source and drain regions of N-type devices, a photolithography process could be used to cover other regions, such as P-type device regions, on substrate 102, with photoresist to prevent etching. As a result, a resist removal process is needed after the etching process and before the next operation. Additional cleaning process could be used to ensure no residual resist remains on the substrate. FIGS. 3G and 3H show the drain regions $110_D$ are removed and portions of fins 104 underneath drain regions $110_D$ are removed to form recesses 127. In some embodiments, recesses 127 extend under a portion of spacers 111. The shapes (or outlines) of the recesses 127 shown in FIGS. 3G and 3H are merely exemplary. Other shapes are also possible. Source regions $110_S$ are also removed and recesses 127 are also formed in the source regions (not shown). The depth $H_R$ of recesses 127 below surface 118 of isolation structures 106 is in a range from about 10 nm to about 20 nm. The recesses 127 may be formed to have either an angular or rounded shape on the bottoms.

After the recesses 127 are formed, an epitaxial material is deposited in recesses 127 to form doped source and drain regions, 110D' and 110S' respectively, at operation 206 of FIG. 2, in accordance with some embodiments. Doped source and drain regions 110D' and 110S' are located right next to the LDD regions 113, which are between channel regions 112 and source/drain regions 110D', 110S'. The dopants in the doped source and drain regions, 110D', 110S', could diffuse into and dope the LDD regions 113 by anneal. In order to dope the LDD regions 113, the dopant concentration of the doped source and drain regions 110D' and 110S' needs to be much higher than the required dopant concentration of the LDD regions 113. For example, if the dopant level (or concentration) of N-type dopant in the LDD regions 113 is at a value equal to or greater than about 1E20 atoms/cm3, the dopant concentration of the doped source and drain regions should have a value equal to or greater than about 3E20 atoms/cm3.

In some embodiments, the epitaxial material filling recesses 127 to form doped source and drain regions, $110_D'$ and $110_S'$, is a silicon-containing material 215. In some embodiments, the epitaxially-grown silicon-containing material 215 is formed by an epitaxial deposition/partial etch process, which repeats the epitaxial deposition/partial etch process at least once. Such repeated deposition/partial etch process is also called a cyclic deposition/etch (CDE) process.

The deposition of the silicon-containing material 215 includes in-situ doping the silicon-containing material 215, in accordance with some embodiments. For example, forming an n-type transistor can use an n-type doping precursor, e.g., phosphine (PH3) and/or other n-type doping precursor. By using the in-situ doping process, the dopant concentration (or level) of the silicon-containing material 215 can be desirably controlled and achieved. In some embodiments, the silicon-containing material 215 can be an n-type doped silicon layer that is doped with phosphorus (Si:P). In some embodiments, the silicon-containing material 215 can be an n-type doped silicon layer that is doped with both phosphorus and carbon (Si:CP). Carbon could impede the out-diffusion of phosphorus from the silicon-containing material 215. Other types of dopants may also be included. In some embodiments, the phosphorus dopant has a concentration in a range from about 7E20 atoms/$cm^3$ to about 3E21 atoms/$cm^3$. In some embodiments, the carbon dopant has a concentration in a range from about 0.1% to about 5% (atomic percent).

In some embodiments, the silicon-containing material 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, the deposition of the silicon-containing material 215 can have a deposition temperature of about 750° C. or less. In other embodiments, the deposition temperature ranges from about 500° C. to about 750° C. The pressure of the deposition process is in a range from about 5 Torr to about 500 Torr, in accordance with some embodiments.

The deposition of the silicon-containing material 215 can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In some embodiments, the silicon-containing precursor can have a flow rate ranging from about 20 standard cubic centimeters per minute (sccm) to about 500 sccm. In other embodiments forming a p-type transistor, the silicon-containing material 215 can be made of at least one material, such as silicon, silicon germanium, other semiconductor materials, and/or any combinations thereof.

As mentioned above, the deposition of the silicon-containing material 215 includes in-situ doping the silicon-containing material 215, in accordance with some embodiments. For example, forming an n-type transistor can use an n-type doping precursor, e.g., phosphorous-containing gases such as phosphine ($PH_3$), arsenic-containing gases such as arsine ($AsH_3$), other n-type dopant-containing gases, or a combination thereof. In some embodiments, the n-type doping precursor can have a flow rate ranging from about 20 sccm to about 500 sccm. A carbon-containing gas, such as monomethylsilane (MMS), is also included to dope the silicon-containing material 215 with carbon, in accordance with some embodiments. In some embodiments, the carbon-containing gas has a flow rate ranging from about 10 sccm to about 600 sccm.

The silicon-containing material 215 in recesses 127 is epitaxial. The deposition process forms a thin epitaxial layer of silicon-containing material in recesses 127 and an amorphous silicon-containing material on non-crystalline surfaces. An etching (or partial etching) process removes the amorphous silicon-containing material and also a portion of the silicon-containing material in recesses 127. The remaining silicon-containing material 215 is formed in each of the recesses 127.

In some embodiments, the etching process 220 can use an etching gas including at least one of hydrogen chloride (HCl), chlorine ($Cl_2$), germanium hydride ($GeH_4$), other suitable etching gases, and/or any combinations thereof. The flow rate of the etching gas can range from about 50 sccm to about 750 sccm, in accordance with some embodiments. In some embodiments, the pressure of the etching process 220 ranges from about 5 Torr to about 500 Torr. In some embodiments, the etching process 220 can have an etching temperature of about 590° C. or less. In other embodiments, the etching temperature can range from about 500° C. to about 590° C. The process temperatures and pressures for the deposition process and etch process to form the silicon-containing material 215 are identical in some embodiments.

The etching process would remove the amorphous silicon-containing material over non-crystalline surface at a rate higher than the removal rate of epitaxial silicon-containing material 215. Therefore, only epitaxial film remains on the substrate surface after a CDE cycle. The epitaxial deposition/partial etch process is repeated a number of times until a desired thickness is reached, as shown in FIGS. 3I and 3J in accordance with some embodiments. As a result, such repeated deposition/partial etch process is called a cyclic deposition/etch (CDE) process. FIGS. 3I and 3J show cross-sectional views of doped drain regions $110_D'$ in accordance with some embodiments. In some embodiments, the total thickness $H_T$ of epitaxial silicon-containing material 215 is in a range from about 40 nm to about 50 nm. The height (or thickness) $H_4$ of doped drain regions $110_D'$ above surface 216 between channel regions 112 and gate dielectric layer 115 is in a range from about 10 nm to about 20 nm, in some embodiments. The height (or thickness) $H_{SD}$ of doped drain regions $110_D'$ above surface 118 is in a range from about 35 nm to about 45 nm, in some embodiments. The shortest distance $W_1$ between two neighboring doped drain regions $110_D'$ is in a range from about 10 nm to about 20 nm, in accordance with some embodiments. The distance $D_S$ between $110_D'$ and the edge of gate dielectric 115 is a range from about 7 nm to about 10 nm, in some embodiments. The shortest distance DT between the $110_D'$ and the edge of gate dielectric 115 is in a range from about 3 nm to 7 nm in accordance with some embodiments. Doped source regions $110_S'$ resemble the doped drain regions $110_D'$. The description above for doped drain regions $110_D'$ also applies for doped source regions $110_S'$.

As mentioned above, the epitaxial silicon-containing material 215 is an n-type doped silicon layer doped with both phosphorus and carbon, in accordance with some embodiments. Carbon could impede the out-diffusion of phosphorus from the silicon-containing material 215. The phosphorus- and carbon-doped silicon layer can be referred to as a Si:CP layer. The dopants in the silicon-containing material 215 deposited by CDE have higher level of activation than implanted dopants. As mentioned above, the dopant activation level is in a range from about 7E20 atoms/$cm^3$ to about 3E21 atoms/$cm^3$, in some embodiments. The n-type dopants, such as P or As, can be driven into LDD regions 113, which is underneath spacers 111 and next to doped source and drain regions $110_D'$, $110_S'$ as shown in FIGS. 3I and 1B, by thermal anneal to increase the dopant concentration in LDD regions 113. In some embodiments, the targeted dopant level in LDD regions 113 is in a range from about 1E20 atoms/$cm^3$ to about 5E20 atoms/$cm^3$. The thermal anneal not only can drive the dopants into the source and drain regions 110D' and 110S' regions, but also can activate the dopants.

FIG. 2 shows that an anneal is performed at operation 207 to drive dopants in the doped source and drain regions into LDD regions and to active dopants, in accordance with some embodiments. Dotted lines 217 in FIG. 3I note the boundaries of areas have the targeted LDD dopant level after the anneal, in accordance with some embodiments. LDD regions 113 are within the boundary. The thermal anneal may utilize rapid thermal processing (RTP) anneal, spike, anneal, millisecond anneal, laser anneal, or a combination thereof.

In some embodiments, the anneal process utilize a 2-stage pre-heat millisecond anneal. Substrate 102 first undergoes a warm-up and is heated to a temperature in a range from about 400° C. to about 600° C. with a duration in a range from about 2 seconds to about 20 seconds, in some embodiments. The wafer then undergoes a second pre-heat at a temperature in a range from about 700° C. at about 900° C. for a duration in a range from about 1 second to about 20 seconds. During the half point of the second stage preheat, the temperature of the wafer is quickly raised to the peak anneal temperature by millisecond anneal. For example, if the preheat duration during the second stage preheat is 4 seconds, the wafer temperature is raised to peak anneal temperature after 2 seconds of the second stage preheat. Flash anneal lamps, such as xenon (Xe) arc lamps or argon (Ar) arc lamps, may be used to achieve such a rapid temperature rise. The second stage preheat continues for another 2 seconds. The peak temperature for the millisecond anneal is in a range from about 950° C. to about 1200° C. for a duration in a range from about 1 milliseconds (ms) to about 40 ms, in accordance with some embodiments.

Figure 4:
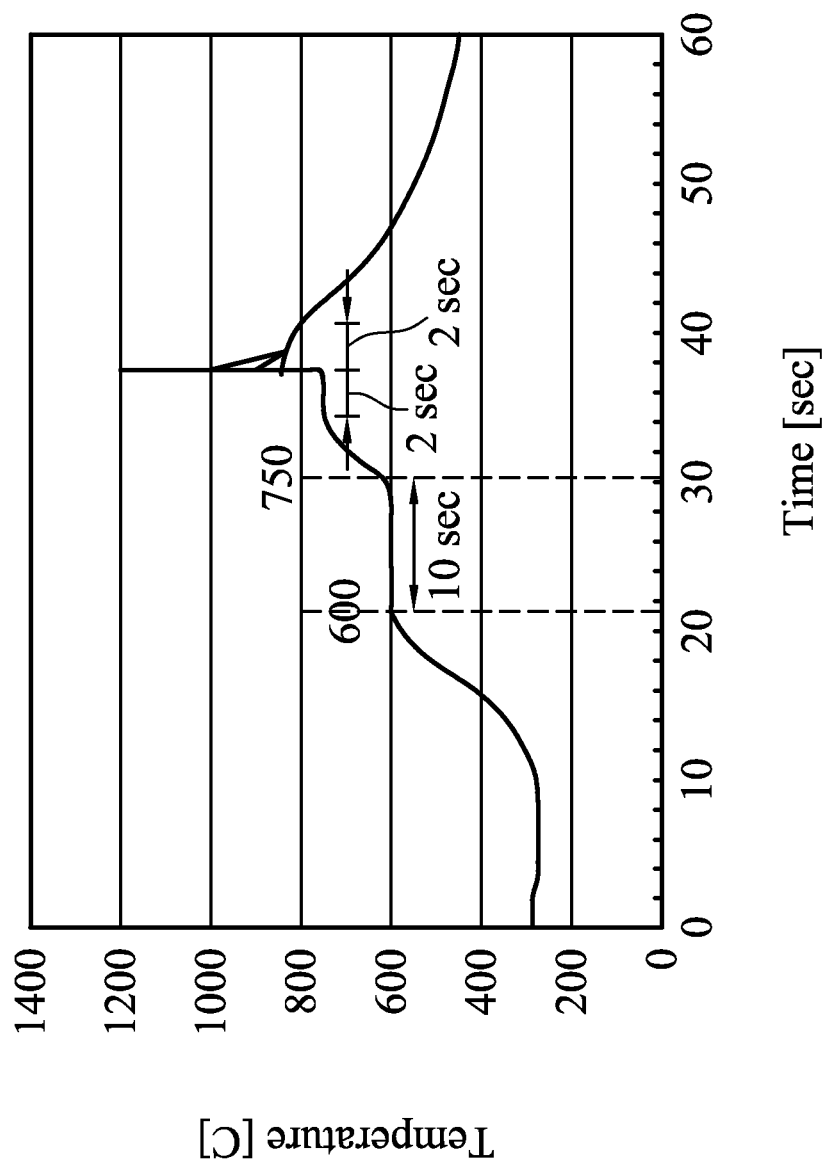
FIG. 4 shows a temperature diagram of a 2-stage preheat millisecond anneal, in accordance with some embodiments.

FIG. 4 shows a temperature diagram of a 2-stage preheat millisecond anneal, in accordance with some embodiments. The millisecond anneal (or flash anneal) portion of FIG. 4 includes profiles of multiple millisecond anneal times (or soak times) from 2 ms to 9 ms with the peak temperature targeted at 1200° C. The substrate is pre-heated to 600° C. and is held for 10 seconds at 600° C. Afterwards, the substrate is raised to 750° C. and is maintained at 750° C. for 4 seconds. As mentioned above, the second stage preheat continues for another 2 seconds. In the middle of the second stage preheat, the millisecond anneal is performed. Other anneal processes may also be used. Details of alternative anneal processes are described in U.S. patent application Ser. No. 13/183,909, titled "Methods of Anneal After Deposition of Gate Layers," and filed on Jul. 15, 2011, which is incorporated herein in its entirety. However the process conditions may be modified to fit the needs to the current disclosure.

Figure 5:
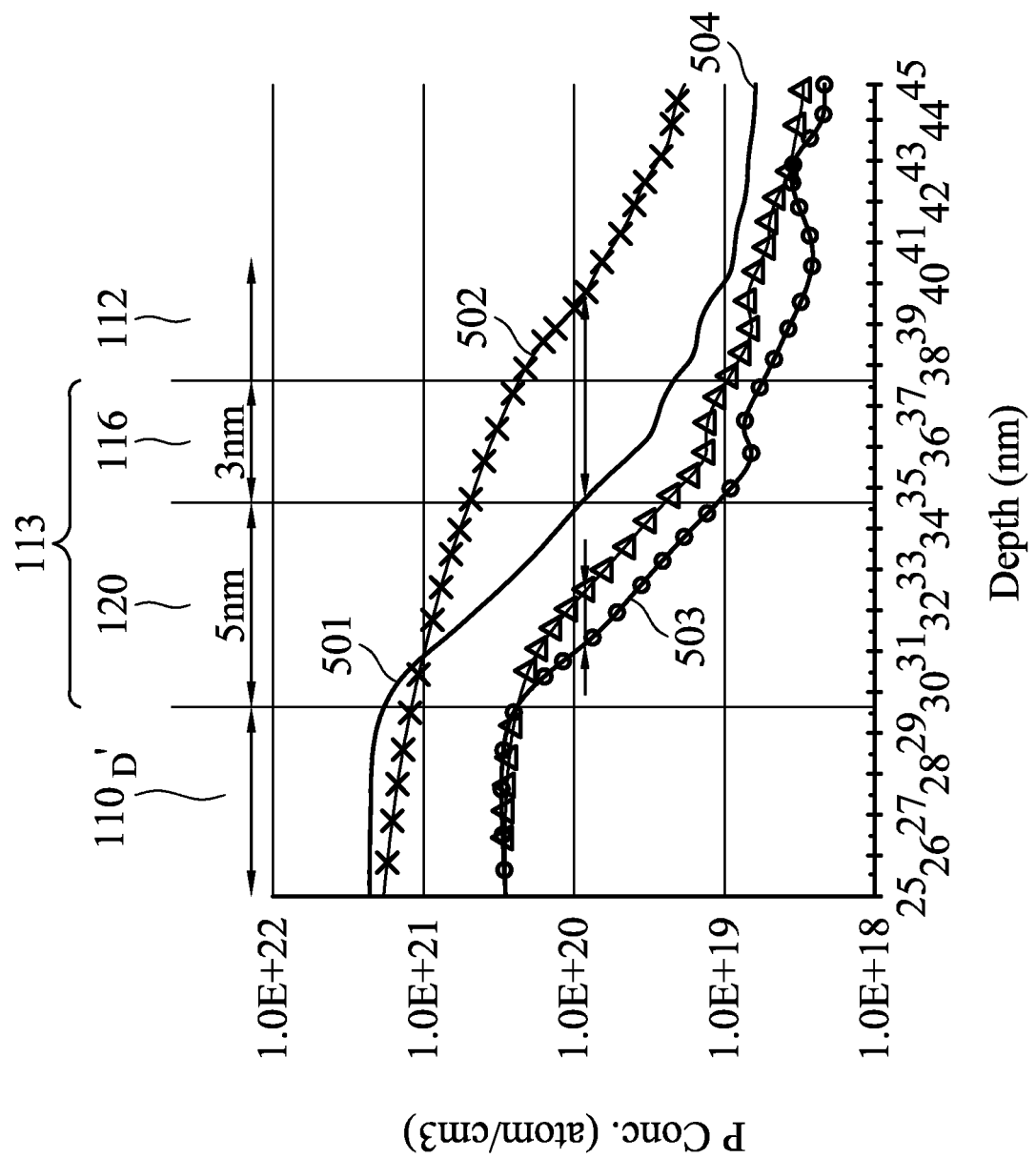
FIG. 5 shows four dopant profiles, in accordance with some embodiments.

FIG. 5 shows two as-deposited dopant (phosphorus, P) profiles 501 and 503, and correlated post-anneal dopant (phosphorus, P) profiles 502 and 504, in accordance with some embodiments. Profile 501 (solid line without additional marks) covers four regions, drain region $110_D'$ (or source region $110_S'$), under main spacer layer 120, under offset spacer layer 116 and in channel region 112. As mentioned above, the region under spacer layers 120 and 116 is LDD region 113. Profile 501 shows that the as-deposited epitaxial silicon-containing material 215 in drain region $110_D'$ has a concentration at about 3E21 atom/cm³. The dopant concentration drops rapidly to 3E19 atoms/cm³ at the edge of channel region 112. Dopants under spacer layers 120 and 116, and in channel region 112 diffuse to these regions during the CDE deposition process. In the embodiment shown in FIG. 5, the thickness of the main spacer layer 120 is about 5 nm and the thickness of the offset spacer layer 116 is about 3 nm. When substrate with dopant profile 501 is annealed using the millisecond anneal process described above. The process use a pre-heat temperature at about 750° C. and undergoes millisecond anneal at about 1120° C. for about 2 ms. Profile 502, which include cross (x) marks, shows that millisecond anneal drives the dopants into LDD region 13 and increase the dopant concentration in this region to above about 4E20 atoms/cm³. Some dopants are driven into channel region 112, as shown in FIG. 5. FinFET devices are more resistant to short channel effect. Device results, such as "on current" $I_{ON}$, show an about 10% performance improvement by using the process described above of forming doped source and drain regions and anneal without LDD ion implant. ION shows an about 10% improvement due to reduction in $R_{external}$ (external resistance) as a result of higher dopant density in the source and drain regions.

Profile 503 (with circle marks) is an as-deposited dopant profile and profile 504 (with triangle marks) is a post-anneal profile of profile 503. The anneal process for profile 504 is the same as the process used for profile 502. Profile 503 has a lower as-deposited concentration at drain region $110_D'$ (7E20 atoms/cm³). Due to the lower as-deposited dopant concentration, the anneal is not able to increase the dopant concentration in the LDD region 113 to above 1E20 atoms/cm³. The results in FIG. 5 show that the as-deposited material 215 should have a relatively high dopant (N-type) concentration.

Figure 6A:
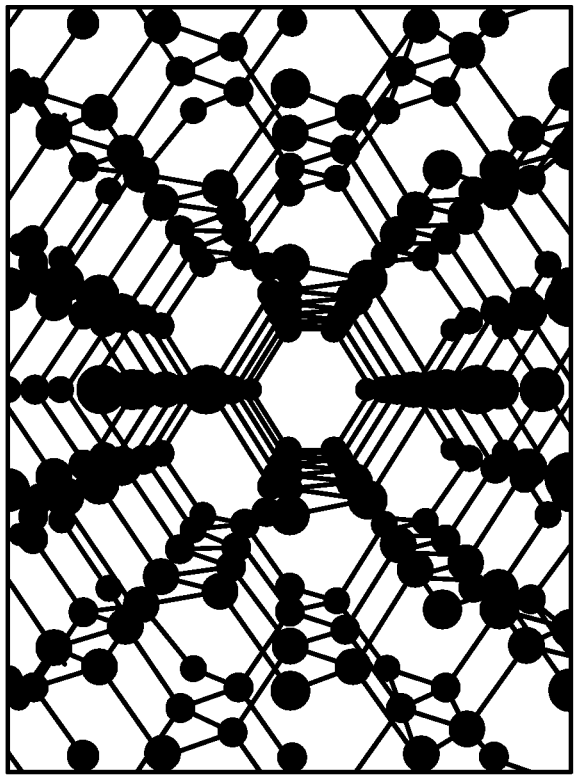
FIG. 6A shows silicon crystalline structures for (100) and (110) orientations.
Figure 6A:
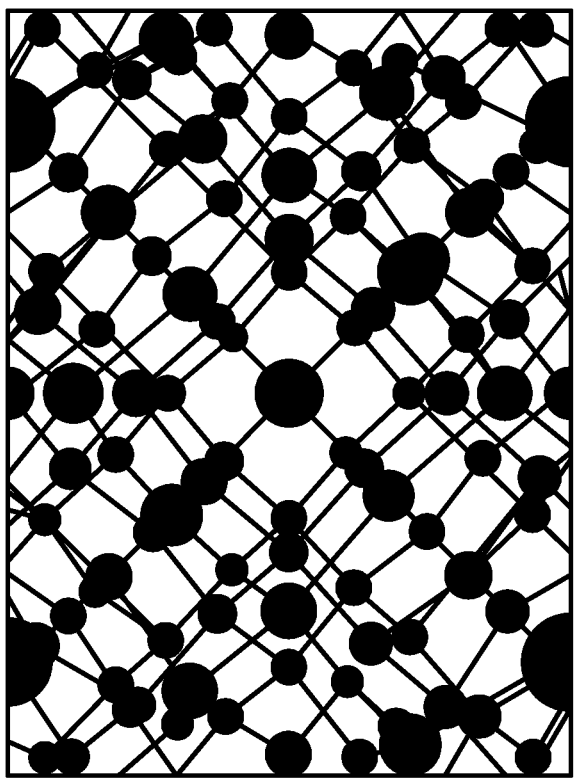
Figure 6B:
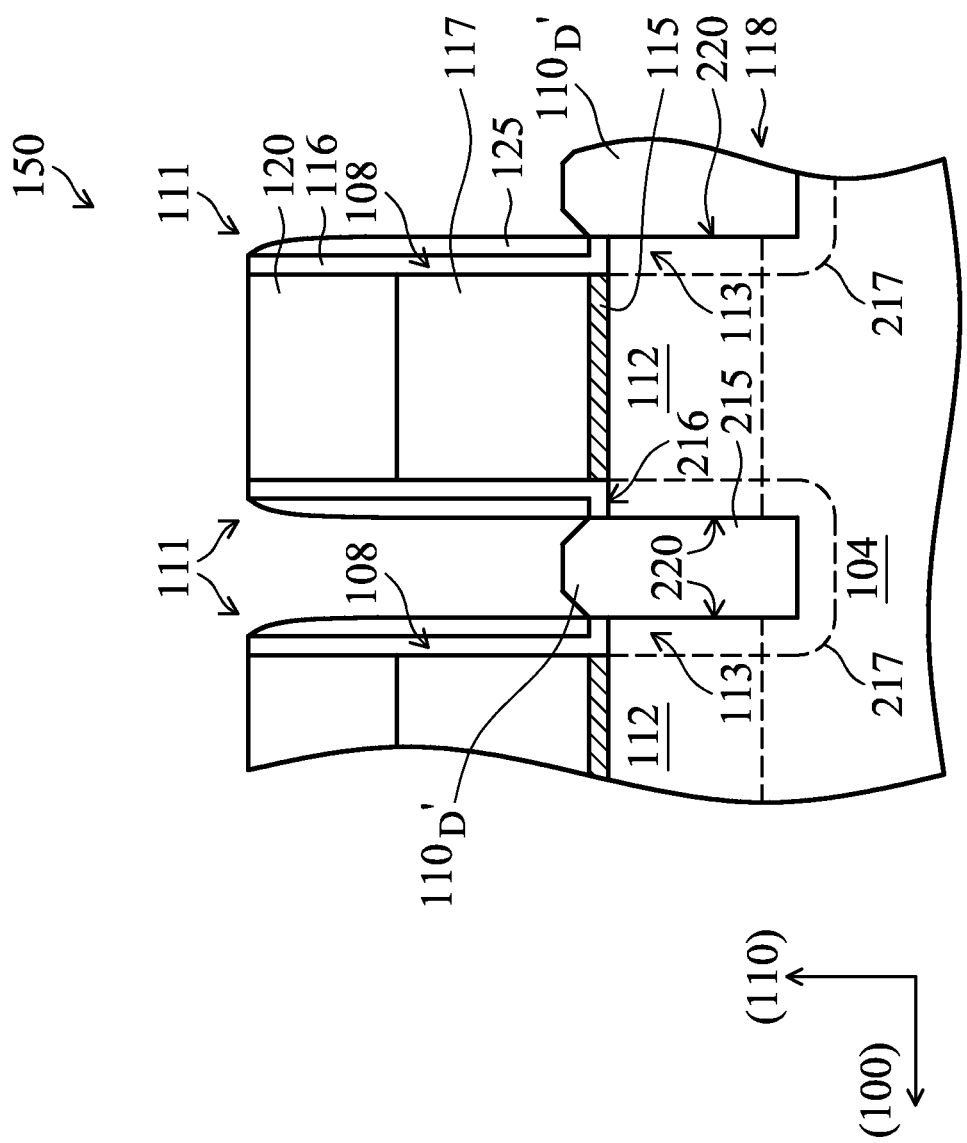
FIG. 6B shows transistor region of FIG. 3I accompanied with crystalline orientations of surfaces of the transistor region, in accordance with some embodiment.

FIG. 6A shows the Si (silicon) crystalline structures for (100) and (110) orientations. The (110) orientation is more open than (100) orientation. As a result, dopants can enter Si surface with 110 orientation than Si surface with (100) orientation. FIG. 6B shows transistor region of FIG. 3I accompanied with crystalline orientations of surfaces of the transistor region, in accordance with some embodiment. As shown in FIG. 6B, N-type dopants in LDD regions 113 mainly are supplied to the regions through the interfaces 221. To enable sufficient and efficient dopant diffusion, the crystalline orientation of doped source and drain regions $110_D'$ and $110_S'$ is desirable to be (110) vertically to allow dopants to diffuse through interfaces 221 to reach LDD regions 113. The surface of substrate 102 have (100) orientation.

Figure 7:
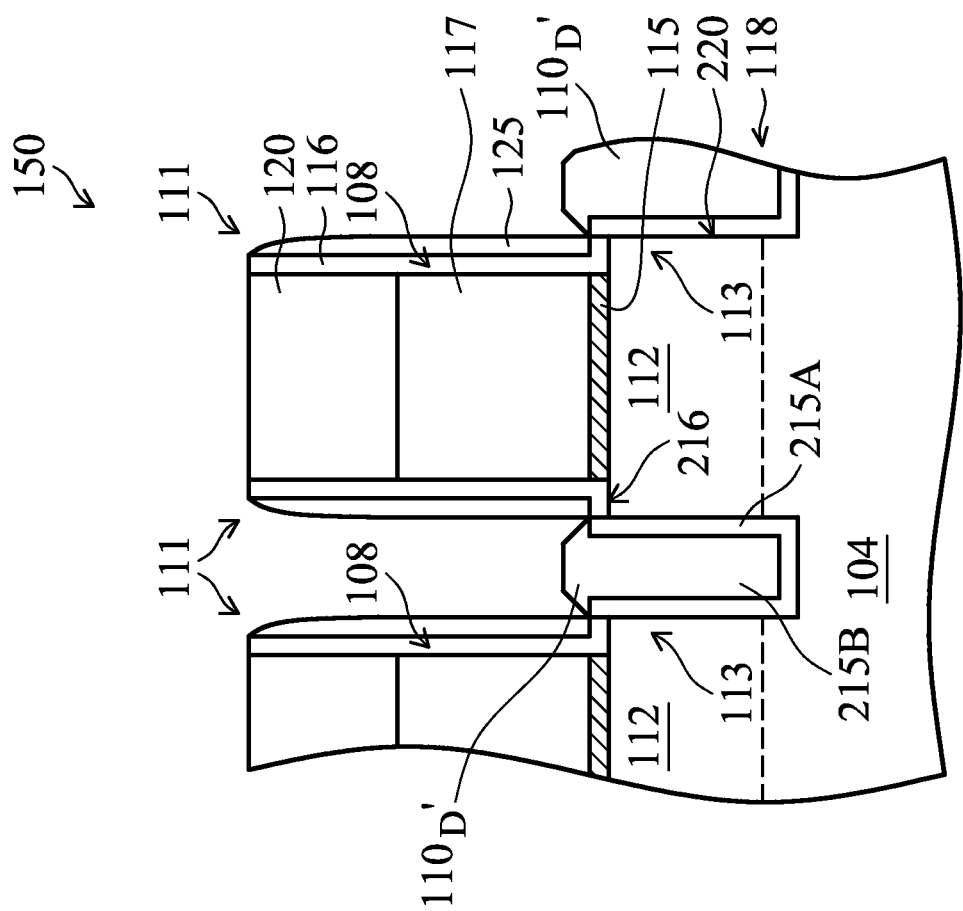
FIG. 7 shows a cross-sectional view of the structure of FIG. 3I with two silicon-containing materials in doped drain regions, in accordance with some embodiments.

As described above, the process described above for epitaxially growing the silicon-containing material 215 to form doped source/drain regions $110_D', 110_S'$ use CDE process to form doped material 215. In addition, the dopant concentration is maintained high to enable dopant diffusion. However, only a thin layer of the doped source next to the LDD regions 113 is needed to provide dopants to the LDD regions. The remaining source/drain regions could be doped at a lower concentration level. FIG. 7 shows a cross-sectional view of the structure of FIG. 3I with two silicon-containing materials $215_A$ and $215_B$ to form the doped drain regions $110_D'$ and before post-deposition anneal, in accordance with some embodiments. The first silicon-containing material $215_A$ is formed first and is similar to the silicon-containing material 215 described above both in process method, film properties, and dopant level(s). It has high dopant concentration to enable doping the LDD regions 113 to reach targeted dopant level. The second silicon-containing material $215_B$ is formed over the first silicon-containing material $215_A$. Both materials $215_A$ and $215_B$ are epitaxial.

The second silicon-containing material $215_B$ may be formed by CDE process that is similar to the process used to form material $215_A$, but with a lower dopant level. However, in some embodiments, the second silicon-containing material 215B is formed by a non-CDE epitaxial process. CDE process is relatively slow; therefore, it could be desirable to use an alternative epitaxial process to form material $215_B$. For example, a selective epitaxial growth (SEG) process may be used to deposit the second silicon-containing material $215_B$. The SEG process has a higher growth rate than the CDE process, in accordance with some embodiments. The SEG process is a selective deposition process and the silicon-containing material $215_B$ formed by this process deposits on epitaxial silicon-containing material $215_A$. SEG processes utilize simultaneous deposition and etch. In some embodiments, the silicon-containing material $215_B$ is doped with phosphorus (Si:P).

In some embodiments, the N-type dopant concentration of material $215_B$ is in a range from about 1E20 atoms/cm³ to about 5E20 atoms/cm³. The thickness of material $215_A$ has a minimal thickness about 10 nm, in some embodiments. The thickness of material 215A is in a range from about 15 nm to about 20 nm, in accordance with some embodiments.

Although the doping mechanisms described above are for N-type devices. Similar doping mechanisms may be applied to P-type devices with necessary modification of process flow and dopant type.

The embodiments of mechanisms for doping LDD regions by driving dopants from highly doped source and drain regions by annealing for finFET devices are provided. The mechanisms overcome the limitation by shadowing effects of ion implantation for advanced finFET devices. The highly doped source and drain regions are formed by epitaxial growing one or more doped silicon-containing materials from recesses formed in the fins. The dopants are then driven into the LDD regions by advanced annealing process, which can achieve targeted dopant levels and profiles in the LDD regions.

In some embodiments, a semiconductor device is provided. The semiconductor device includes a substrate having an N-type fin field-effect-transistor (N-finFET) region, and a gate structure formed over a fin structure, wherein the fin structure contains crystalline silicon-containing material. A portion of the fin structure protrudes above neighboring isolation structures. The semiconductor device also includes a channel region in the fin structure, and the channel region is surrounded by the gate structure. The semiconductor device further includes a doped source or drain region, and the doped source or drain region is separated from the channel region by a spacer structure. In addition, the semiconductor device includes a lightly doped drain (LDD) region between the source or drain region and the channel region. The LDD region is under the spacer structure. An average dopant concentration of an N-type dopant of the doped source or drain region is significantly higher than the LDD region to supply dopants to the LDD region.

In some other embodiments, a method of forming a semiconductor device on a semiconductor substrate is provided. The method includes providing the substrate with a first plurality of fins and a second plurality of gate structures, and forming spacers on each of the second plurality of gate structures. The method also includes etching portions of the first plurality of fins not covered by the plurality of gate structures to form recesses in the first plurality of fins below exposed surfaces of isolation structures between the first plurality of fins. The recesses are below surfaces of isolation structures neighboring the fins. The method further includes forming doped source and drain regions for the second plurality of gate structures by epitaxially growing at least one silicon-containing material from the recesses. In addition, the method includes annealing the substrate to drive dopants in the doped source and drain regions to lightly doped drain (LDD) regions under the spacers and in the first plurality of fins to dope the LDD regions.

In yet some other embodiments, a method of forming a semiconductor device on a semiconductor substrate is provided. The method includes providing the substrate with a first plurality of fins and a second plurality of gate structures, and doping lightly doped regions (LDD) regions in the plurality of fins near the second plurality of gate structures. The method also includes forming spacers on each of the second plurality of gate structures, and etching portions of the first plurality of fins not covered by the plurality of gate structures to form recesses in the first plurality of fins below exposed surfaces of isolation structures between the first plurality of fins. The recesses are below surfaces of isolation structures neighboring the fins. The method further includes forming doped source and drain regions for the second plurality of gate structures by epitaxially growing at least one silicon-containing material from the recesses. In addition, the method includes annealing the substrate to drive dopants in the doped source and drain regions to the LDD regions under the spacers and in the first plurality of fins to dope the LDD regions.

It is understood that different embodiments disclosed herein offer different disclosure, and that they may make various changes, substitutions and alterations herein without departing from the spirit and scope of the present disclosure. For example, the embodiments disclosed herein describe formation of a tensile stress in a fin region. However, other embodiments may include forming a compressive stress in fin region by providing the relevant stress layer (e.g., stress-transferring layer) overlying the fin region. Examples of compressive stress generating films may include metal nitride compositions.

What is claimed is:

1. A method of forming a semiconductor device on a semiconductor substrate, comprising:
    providing the substrate with a plurality of fins and a plurality of gate structures;
    forming spacers on each of the plurality of gate structures;
    etching respective portions of the plurality of fins not covered by the plurality of gate structures to form recesses in the plurality of fins below exposed surfaces of isolation structures between the plurality of fins, wherein the recesses are below the exposed surfaces of the isolation structures;
    forming doped source and drain regions for the plurality of gate structures by epitaxially growing at least one silicon-containing material from within the recesses; and
    annealing the substrate using a two-stage pre-heat millisecond anneal to drive dopants in the doped source and drain regions to lightly doped drain (LDD) regions under the spacers and in the plurality of fins to dope the LDD regions.

2. The method of claim 1, wherein dopants in the doped source and drain regions are N-type for forming N-type fin field-effect-transistor (finFET) devices.

3. The method of claim 1, wherein the doped source and drain regions have an average dopant concentration in a range from about 1E20 atoms/cm$^3$ to about 5E20 atoms/cm$^3$.

4. The method of claim 1, wherein the at least one silicon-containing material includes a first silicon-containing material and a second silicon-containing material; and wherein the first silicon-containing material is grown first and has a dopant concentration higher than the second silicon-containing material.

5. The method of claim 1, wherein the at least one silicon containing material is grown by a cyclic deposition/etch (CDE) process.

6. The method of claim 4, wherein the thickness of the first silicon-containing material is in a range from about 15 nm to about 20 nm.

7. The method of claim 1, wherein the annealing process is a two-stage preheat millisecond anneal with a peak temperature in a range from about 950° C. to about 1200° C.

8. The method of claim 1, further comprising:
    performing an LDD ion implant prior to forming spacers; and
    performing dopant anneal after the LDD ion implantation.

9. The method of claim 1, wherein crystalline structures of the respective fin structures have an (110) orientation normal to the surface of the substrate to enable efficient doping of the LDD regions.

10. A method of forming a semiconductor device on a semiconductor substrate, comprising:
    providing the substrate with a plurality of fins and a plurality of gate structures;
    doping lightly doped regions (LDD) regions in the plurality of fins near the plurality of gate structures;
    forming spacers on each of the plurality of gate structures;
    etching portions of the plurality of fins not covered by the plurality of gate structures to form recesses in the plurality of fins below exposed surfaces of isolation structures between the plurality of fins, wherein the recesses extend below surfaces of isolation structures neighboring the fins;
    forming doped source and drain regions for the plurality of gate structures by epitaxially growing at least one silicon-containing material from within the recesses; and
    performing a two-stage pre-heat millisecond anneal on the substrate to drive dopants in the doped source and drain regions to the LDD regions under the spacers and in the plurality of fins to dope the LDD regions.

11. The method of claim 10, wherein the step of doping lightly doped regions (LDD) regions comprises ion implanting dopants into the respective fins.

12. The method of claim 11, wherein the ion implanting is dopant at an implant angle of between about 0° to about 45° relative to respective sidewalls of the respective gate structures.

13. The method of claim 11, further comprising:
    performing an LDD ion implant prior to forming spacers; and
    performing dopant anneal after the LDD ion implantation.

14. The method of claim 11, wherein the step of forming doped source and drain regions includes a cyclic deposition/etch process.

15. The method of claim 11, wherein the step of forming doped source and drain regions includes in situ doping the silicon-containing material during the epitaxially growing step.

16. The method of claim 11, wherein the step of annealing includes a two-stage preheat millisecond anneal with a peak temperature in a range from about 950° C. to about 1200° C.

17. A method of forming a semiconductor device on a semiconductor substrate, comprising:
    forming a fin structure extending from a major surface of the substrate;
    forming a gate structure over a portion of the fin;
    forming a spacer layer on the fin and gate structure;

ion implanting a dopant through the spacer layer and into the fin structure to form a lightly doped drain region;

performing a first anneal on the fin structure;

forming spacers on sidewalls of the gate structure;

etching the fin structure to form a drain recess in the fin structure;

epitaxially growing a doped drain region in the drain recess; and performing a two-stage pre-heat millisecond anneal to drive impurities from the doped drain region into the lightly doped drain region.

18. The method of claim 17, wherein the step of ion implanting a dopant through the spacer layer and into the fin structure to form a lightly doped drain region includes implanting dopants at an angle of about 45° relative to a line orthogonal to the major surface of the substrate.

19. The method of claim 17, wherein the step of performing a second anneal to drive impurities from the doped drain region into the lightly doped drain region results in the doped drain region having an average dopant concentration in a range from about 7E20 atoms/cm$^3$ to about 3E21 atoms/cm$^3$, and the lightly doped drain region having an average dopant concentration in a range from about 1E20 atoms/cm$^3$ to about 5E20 atoms/cm3.

* * * * *